(12) United States Patent
Qu et al.

(10) Patent No.: US 9,006,858 B2
(45) Date of Patent: Apr. 14, 2015

(54) HIGH-VOLTAGE TRENCH JUNCTION BARRIER SCHOTTKY DIODE

(71) Applicants: Ning Qu, Reutlingen (DE); Alfred Goerlach, Kusterdingen (DE)

(72) Inventors: Ning Qu, Reutlingen (DE); Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/361,988

(22) PCT Filed: Nov. 12, 2012

(86) PCT No.: PCT/EP2012/072378
§ 371 (c)(1),
(2) Date: May 30, 2014

(87) PCT Pub. No.: WO2013/079304
PCT Pub. Date: Jun. 6, 2013

(65) Prior Publication Data
US 2015/0028445 A1    Jan. 29, 2015

(30) Foreign Application Priority Data
Dec. 1, 2011   (DE) .......................... 10 2011 087 591

(51) Int. Cl.
*H01L 29/47* (2006.01)
*H01L 29/40* (2006.01)
*H01L 29/872* (2006.01)
*H01L 29/06* (2006.01)

(52) U.S. Cl.
CPC ........ *H01L 29/8725* (2013.01); *H01L 29/0634* (2013.01); *H01L 29/47* (2013.01); *H01L 29/872* (2013.01)

(58) Field of Classification Search
CPC .............................. H01L 29/872; H01L 29/47
USPC .......................................... 257/471, 475, 485
See application file for complete search history.

(56) References Cited

U.S. PATENT DOCUMENTS

| | | | |
|---|---|---|---|
| 4,982,260 A * | 1/1991 | Chang et al. | 257/656 |
| 6,501,146 B1 * | 12/2002 | Harada | 257/475 |
| 6,710,418 B1 * | 3/2004 | Sapp | 257/471 |
| 2008/0128850 A1 * | 6/2008 | Goerlach et al. | 257/476 |
| 2010/0314659 A1 * | 12/2010 | Yilmaz et al. | 257/139 |
| 2012/0181652 A1 * | 7/2012 | Qu et al. | 257/471 |
| 2012/0256196 A1 * | 10/2012 | Qu et al. | 257/77 |

(Continued)

FOREIGN PATENT DOCUMENTS

| | | |
|---|---|---|
| DE | 197 40 195 C2 | 12/1999 |
| EP | 1 139 433 | 10/2001 |

(Continued)

OTHER PUBLICATIONS

International Search Report for PCT/EP2013/072378, dated Jan. 28, 2013.

(Continued)

*Primary Examiner* — Ngan Ngo
(74) *Attorney, Agent, or Firm* — Kenyon & Kenyon LLP

(57) ABSTRACT

In a Schottky diode having an $n^+$-type substrate, an n-type epitaxial layer, at least two p-doped trenches introduced into the n-type epitaxial layer, mesa regions between adjacent trenches, a metal layer functioning as a cathode electrode, and another metal layer functioning as an anode electrode, the thickness of the epitaxial layer is more than four times the depth of the trenches.

7 Claims, 5 Drawing Sheets

(56) References Cited

U.S. PATENT DOCUMENTS

| | | |
|---|---|---|
| 2014/0035090 A1* | 2/2014 | Qu et al. ................. 257/475 |
| 2014/0145207 A1* | 5/2014 | Yen et al. ................. 257/77 |
| 2014/0175457 A1* | 6/2014 | Yen et al. ................. 257/77 |
| 2014/0353667 A1* | 12/2014 | Konrath et al. ............ 257/66 |

FOREIGN PATENT DOCUMENTS

| | | |
|---|---|---|
| JP | 2000/252478 | 9/2000 |
| WO | WO 2006/048387 | 5/2006 |

OTHER PUBLICATIONS

Baglia et al.: "Analysis of junction-barrier-controlled Schottky (JBS) rectifier characteristics", Solid State Electronics, Bd. 28, No. 11, Nov. 1, 1985 pp. 1089-1093.

* cited by examiner

HIGH-VOLTAGE TRENCH JUNCTION BARRIER SCHOTTKY DIODE

BACKGROUND OF THE INVENTION

1. Field of the Invention

The present invention relates to a Schottky diode which is suitable for high-voltage applications and additionally has a low forward voltage, a low leakage current, low switching losses and great robustness.

2. Description of the Related Art

High-voltage PN diodes are generally used for high-voltage applications. Such high-voltage PN diodes advantageously have a low leakage current and great robustness. Disadvantages of such high-voltage PN diodes include their high forward voltage and high switching power loss.

In such a high-voltage PN diode, the voltage is taken over mainly by the weakly doped region provided with such diodes. Electrons and holes are injected into the weakly doped region in the case of operation in the forward direction. At a high current density, high injection prevails in the weakly doped region, and the electron density and hole density are higher than the dopant concentration of the weakly doped region. The conductivity of the weakly doped region is thereby increased. This advantageously results in a reduction in the forward voltage. However, the current of a high-voltage PN diode begins to flow at room temperature only above a forward voltage of approximately UF=0.7 V. Under normal operating conditions, for example, at a current density greater than 100 A/cm$^2$, forward voltage UF increases to values greater than 1 V. This is associated with a correspondingly high undesirable power loss. Since a high-voltage PN diode requires a thick, weakly doped region, the voltage drop in the forward direction over the weakly doped region is relatively great despite the conductivity modulation.

The charge carriers (electrons and holes) which are injected into the weakly doped region during operation in the forward direction and stored there must first be reduced during shutdown, for example, in an abrupt current commutation, before the high-voltage PN diode is at all capable of taking over the reverse voltage again. Therefore, in an abrupt current commutation, current continues to flow first in the reverse direction until the stored charge carriers have been drained off or reduced. This process, i.e., the level and duration of the drain current for reduction of the stored charge carriers, is determined primarily by the quantity of charge carriers stored in the weakly doped region. A higher and longer-lasting drain current means a higher shutdown power loss.

An improvement in the switching behavior is offered by Schottky diodes (metal semiconductor contacts and silicide semiconductor contacts). In the case of Schottky diodes, there is no high injection during forward operation and therefore the drain-off of the minority charge carriers during shutdown is eliminated. They switch rapidly and with almost no power loss. However, they are associated with high leakage currents, in particular at high temperatures and with a great voltage dependence because of the barrier-lowering effect. Furthermore, thick semiconductor layers with a low level of doping are again required for high barrier voltages, which results in unacceptable, high forward voltages at high currents. Therefore power Schottky diodes in silicon technology are not suitable for barrier voltages of more than approximately 100 V—despite the good switching behavior.

German patent DE 197 40 195 C2 describes a Schottky diode, hereinafter also referred to as a cool SBD. A significant reduction in resistance is possible with this cool SBD due to the introduction of doped p- and n-conducting columns situated alternately below a Schottky contact. If the column width is reduced, the column doping may be increased. The doping of the p and n columns is selected in such a way that when reverse voltage is applied, all doping atoms are ionized. This principle is also known as the super junction principle (SJ). Since high injection occurs during the forward operation of a high current density in a cool SBD, the ideal switching behavior of a pure Schottky diode is not achieved, but is significantly improved in comparison with a PN diode. However, the low forward voltage of a PN diode is not achieved at high currents.

FIG. 1 shows one example of such a known cool SBD. This cool SBD has an n$^+$ substrate 10 on which an n-epitaxial layer 20 of thickness D_epi and of doping concentration ND is situated. N-epitaxial layer 20 contains etched trenches 30, which are filled with p-doped silicon of doping concentration NA and with p$^+$-doped silicon in upper regions 40. The width of the n-epitaxial layer between adjacent trenches 30 is Wn, that of trenches 30 is Wp. Dopings and widths are selected in such a way that these regions are depleted when the full reverse voltage is applied (super junction principle). This is the case at approximately NA·Wp=ND·Wn=10$^{12}$ cm$^{-2}$. The n-doped regions 20 and p$^+$-doped regions 40 are covered with a continuous metal layer 50 on front side V of the cool SBD, which is preferably implemented as a chip, this metal layer forming a Schottky contact with n-doped regions 20 and an ohmic contact with p$^+$-doped regions 40. Metal layer 50 is the anode electrode of the cool SBD. The height of the barrier of Schottky diode 50-20 may be adjusted through the choice of a corresponding metal 50. For example, nickel or NiSi may be used as metal layer 50. If necessary, other metal layers (not shown) may be situated over functional layer 50 to make the surface solderable or bondable, for example. A metal layer or a metal system 60 which forms the ohmic contact with highly n$^+$-doped substrate 10 is likewise situated on rear side R of the chip. This layer or layer sequence is usually suitable for soldering or other assembly. For example, it may have a sequence of Cr/NiV and Ag. Metal system 60 forms the cathode connection of the cool SBD.

The configuration described above may be regarded as a parallel circuit of Schottky diodes and PN diodes. Metal contact 50 forms Schottky diodes with n-doped columns 20. The PN structure is formed by the layer sequence of p$^+$ region 40, p region 30 and substrate 10 as a p$^+$/p/n$^+$ structure.

When a reverse voltage is applied, the p- and n-doped columns are depleted. With a decline in width Wp and Wn, the doping may be increased—at least up to a certain limit, which results from the fact that the space-charge regions are already colliding at a low voltage. This reduces the path resistance of Schottky diodes 50-20-10 in the forward direction. The forward voltages are therefore lower than with a simple Schottky diode, which must be designed with a lower doping at the same reverse voltage. In addition, some current still flows through the PN diodes in the forward direction. Therefore, the forward voltage is further reduced, in particular at a high current density. However, the minority charge carriers must also be drained off again during a shutdown with negative effects for the switching time.

BRIEF SUMMARY OF THE INVENTION

A Schottky diode is suitable for high-voltage applications and advantageously has a low forward voltage, a low leakage current, low switching losses and great robustness. These advantages are achieved by the fact that the Schottky diode according to the present invention has an n$^+$ substrate, an n-epitaxial layer having a thickness, at least two trenches introduced into the n-epitaxial layer, each having a width and a depth, mesa regions between the adjacent trenches, each mesa regions having a width, a metal layer on the rear side of the Schottky diode functioning as a cathode electrode and a metal layer on the front side of the Schottky diode functioning as an anode electrode, the following equation holding for the depth of the trenches and the thickness of the n-epitaxial layer:

$$K \cdot Dt < D\_epi,$$

where Dt is the depth of the trenches, D_epi is the thickness of the n-epitaxial layer and K is a factor for which it holds that $$K > 4.$$

Additional advantageous properties of the present invention are derived from the following exemplary explanation with reference to the drawings.

DETAILED DESCRIPTION OF THE INVENTION

Figure 1:
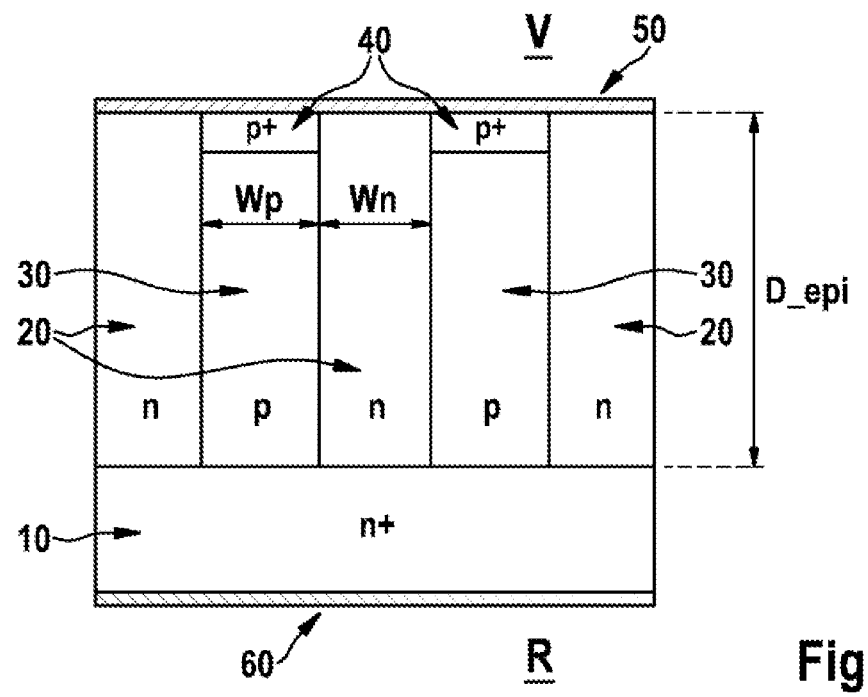
FIG. 1 shows a conventional Schottky diode.
Figure 2:
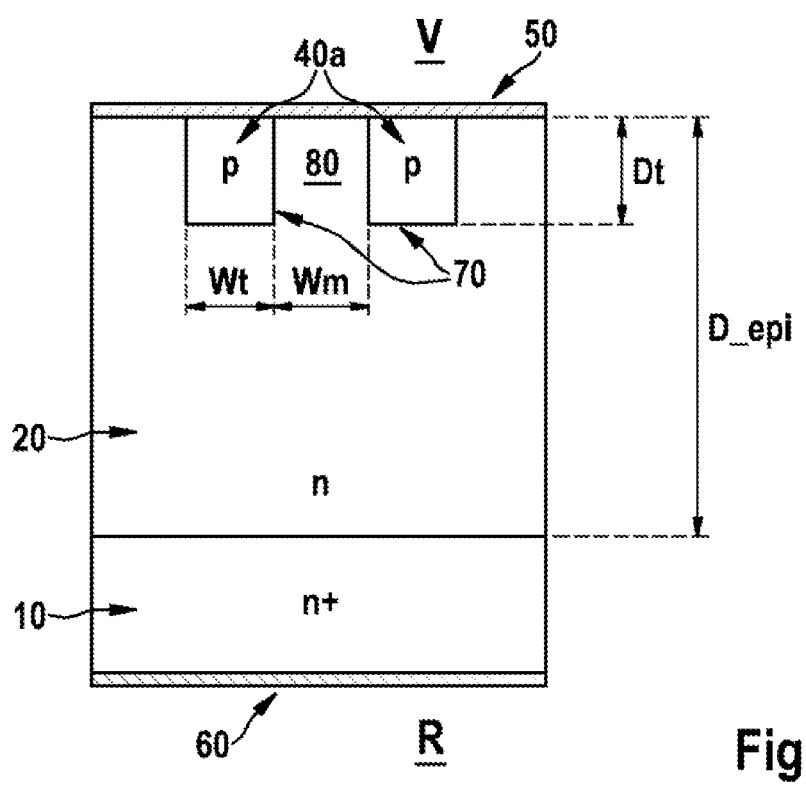
FIG. 2 shows a diagram to illustrate a Schottky diode according to the present invention.

FIG. 2 shows a diagram to illustrate a Schottky diode according to the present invention. This Schottky diode, which is preferably implemented in the form of a chip, is also referred to below as a high-voltage trench junction barrier Schottky diode or HV-TJBS.

The HV-TJBS shown in FIG. 2 has an n$^+$ substrate 10, an n-epitaxial layer 20, trenches 70 etched into n-epitaxial layer 20, a metal layer 50 on front side V of the chip as an anode electrode and a metal layer 60 on rear side R of the chip as a cathode electrode. Trenches 70 are filled with highly p-doped silicon or polysilicon 40a. Metal layers 50 and 60 may also be made of two or more different metal layers situated one above the other. This is not shown in FIG. 2 for the sake of clarity. From an electrical standpoint, the HV-TJBS is a combination of a trench PN diode (PN junction between p-doped trenches 70 as the anode and n-epitaxial layer 20 as the cathode) and a Schottky diode (Schottky barrier between metal layer 50 as the anode and the weakly doped n-epitaxial layer 20 as the cathode). The doping of the n-epitaxial layer is selected in such a way that there is high injection during operation with high currents in the forward direction.

In the forward direction, currents flow first only through the Schottky diode. Due to a lack of lateral p diffusion, the effective area for the current flow in the forward direction is much greater with the HV-TJBS than with a conventional junction barrier Schottky diode without a trench structure. With an increase in currents, forward currents increasingly also flow through the PN junction.

In the reverse direction, the space-charge regions expand with an increase in voltage and collide in the center of the region between adjacent p trenches 70 at a voltage lower than the breakdown voltage of the HV-TJBS. The Schottky effect, which is responsible for high reverse currents, is therefore shielded and the reverse currents are thus reduced. This shielding effect depends greatly on structure parameters Dt (depth of the trench) and Wm (spacing between trenches). The shielding effect of the HV-TJBS of the present invention is much greater than that with conventional JBSs without a trench structure. In comparison with a cool SBD, the shielding effect of an HV-TJBS is also much greater since an HV-TJBS has an abrupt PN junction instead of a charge compensation of the p and n regions. The p regions 40a are doped to a much higher level than n region 20. The SJ condition does not prevail, but instead it holds that NA·Wt>>ND·Wm, where NA is the doping concentration in trenches 70, Wt is the width of trenches 70, ND is the doping concentration in n-epitaxial layer 20 and Wm is the width of the n-epitaxial layer between two trenches 70.

Depth Dt of the trenches is much smaller than thickness D_epi of n-epitaxial layer 20. It preferably holds that:

$$K \cdot Dt < D\_epi, \text{ where } K > 4.$$

This dimensioning achieves the result that the largest possible region of n-epitaxial layer 20 is flooded with charge carriers or there is charge carrier modulation (high injection) in the largest possible region.

An HV-TJBS according to the present invention offers great robustness due to its clamp function. Breakdown voltage BV_pn of the PN diode is designed in such a way that BV_pn is lower than breakdown voltage BV_Schottky of the Schottky diode, and furthermore, the breakdown occurs at the bottom of trenches 70. During breakdown operation, current then flows only through the PN junction. Forward operation and breakdown operation occur at different locations and are therefore separated geometrically. The HV-TJBS of the present invention therefore has a robustness similar to that of a high-voltage PN diode.

At comparable breakdown voltages, e.g., 650 V, the reverse currents at room temperature of the HV-TJBS according to the present invention and a PN diode are comparable and are smaller than those with a cool SBD by more than one order of magnitude. At a high temperature, the leakage currents of an HV-TJBS are definitely elevated because of the temperature dependence of the leakage current of a Schottky contact, but they still remain much lower than with a cool SBD.

Figure 3:
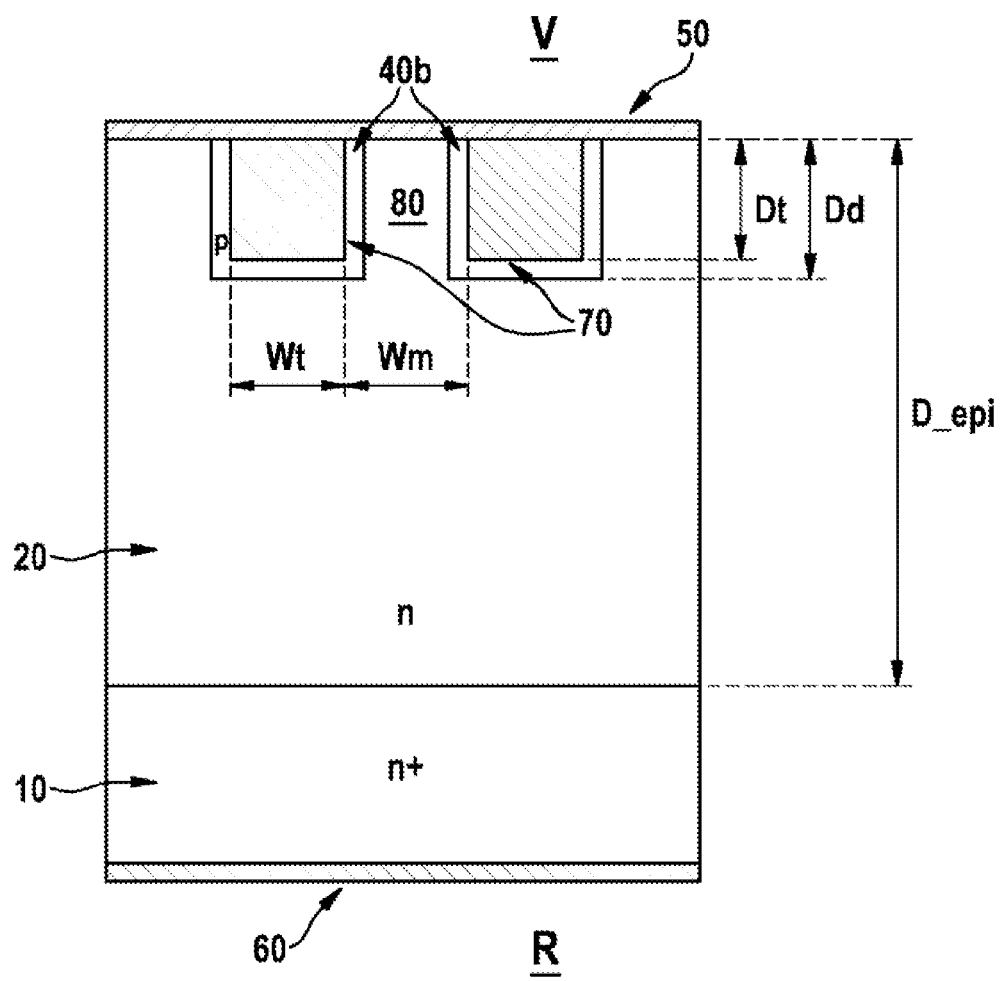
FIG. 3 shows a diagram to illustrate an alternative specific embodiment of a Schottky diode according to the present invention.

FIG. 3 shows a diagram illustrating an alternative specific embodiment of a Schottky diode according to the present invention. In this alternative specific embodiment, the Schottky diode also has an n$^+$ substrate 10, an n-epitaxial layer 20, trenches 70 etched into n-epitaxial layer 20, a metal layer 50 on front side V of the Schottky diode, implemented in the form of a chip, the metal layer functioning as an anode electrode, and a metal layer 60 on rear side R of the Schottky diode implemented in the form of a chip, this metal layer functioning as a cathode electrode. In this specific embodiment, metal layer 50 extends into the surface of trenches 70 and is also capable of completely filling trenches 70.

In this specific embodiment, the PN junctions of the Schottky diode are implemented by a shallow diffusion. For this purpose, trenches 70 are occupied by boron as a doping material and a subsequent shallow p diffusion, labeled with reference numeral 40b in FIG. 3. In this specific embodiment, the shielding action of Schottky effects and the blocking capability are similar to those with the Schottky diode described with reference to FIG. 2, in which the trenches are filled with p-doped silicon or p-doped polysilicon due to a rich and shallow diffusion with a depth of penetration of 2 μm, for example, at a trench depth of 2 μm, for example. A high current-carrying capacity in the forward direction and great robustness are achieved in this alternative specific embodiment.

One advantage of this specific embodiment in comparison with the specific embodiment shown in FIG. 2 lies in a simplification of the process, which is given in the case of occupation of the trenches and subsequent diffusion in comparison with filling up trenches.

Figure 8:
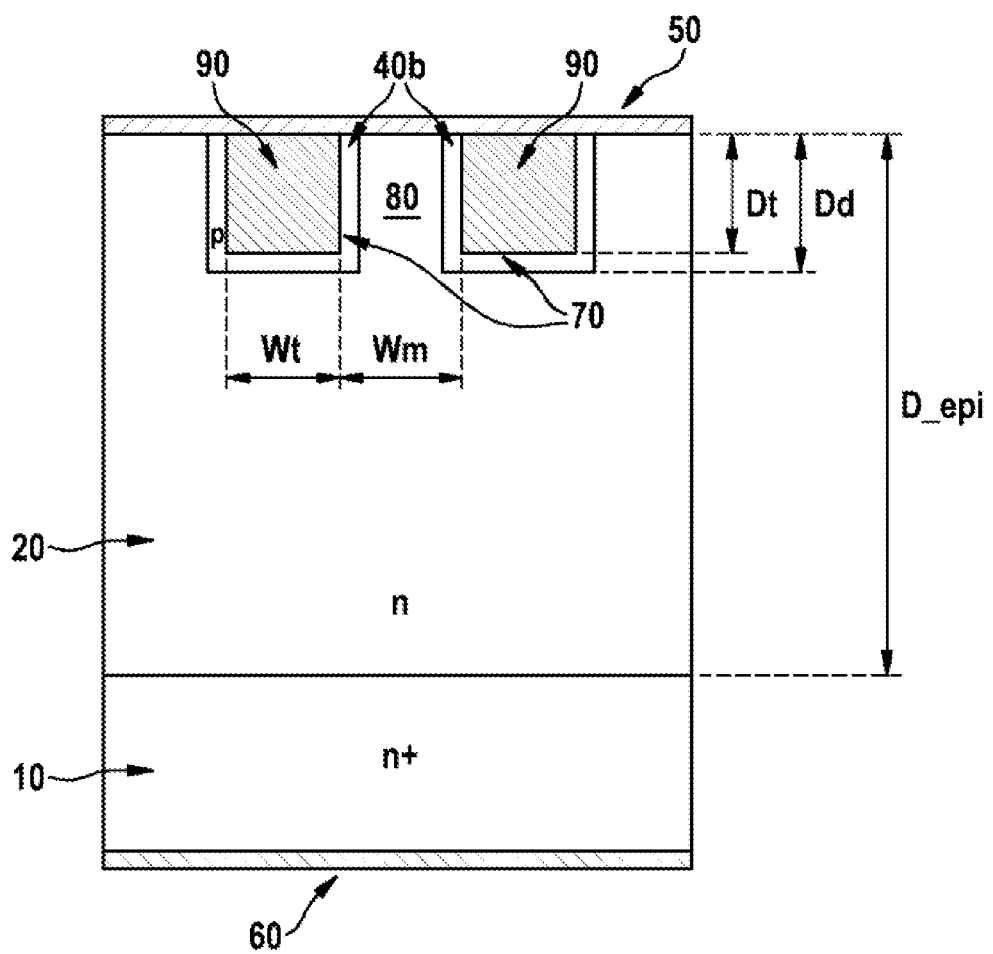
FIG. 8 shows a diagram illustrating another alternative specific embodiment of a Schottky diode according to the present invention.

FIG. 8 shows an alternative specific embodiment, based on the exemplary embodiment according to FIG. 3. The difference is that metal layer 50 does not extend into the trenches but instead there is a highly p-doped layer 90 of polysilicon in trenches 70.

Figure 4:
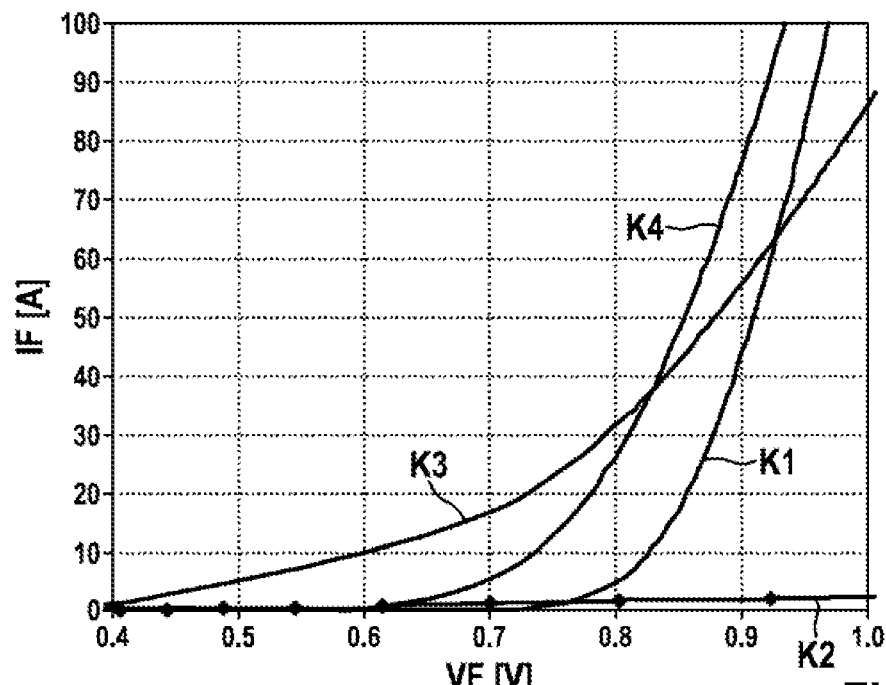
FIG. 4 shows a diagram illustrating flow characteristic lines.

FIG. 4 shows a diagram illustrating forward characteristic lines, forward voltage VF or conducting-state voltage in volts being plotted along the abscissa and forward current IF or conducting-state voltage in amperes plotted along the ordinate. These forward characteristic lines were ascertained by using 600 V components having a chip area of 26 mm$^2$ at a temperature of 25° C. Characteristic line K1 is the forward characteristic line of a traditional high-voltage PN diode made of silicon. Characteristic line K2 is the forward characteristic line of a silicon Schottky diode (Si-SBD). Characteristic line K3 is the forward characteristic line of a cool SBD. Characteristic line K4 is the forward characteristic line of an HV-TJBS according to the present invention.

The barrier height of the Schottky diode, of the cool SBD and of the HV-TJBS according to the present invention is thus 0.72 eV in each case.

As is apparent from these characteristic lines, the forward voltage of an HV-TJBS is lower than that with a PN diode up to a current density of approximately 400 A/cm$^2$ (corresponding to approximately 100 A for a chip area of 26 mm$^2$). This results from a large portion of the current flowing through the Schottky contact. In comparison with a cool SBD having the same barrier height, an HV-TJBS offers advantages at current densities greater than approximately 150 A/cm$^2$. This may be attributed to the fact that, at a high current density, the high injection in a cool SBD is not as strong as that in an HV-TJBS.

Figure 5:
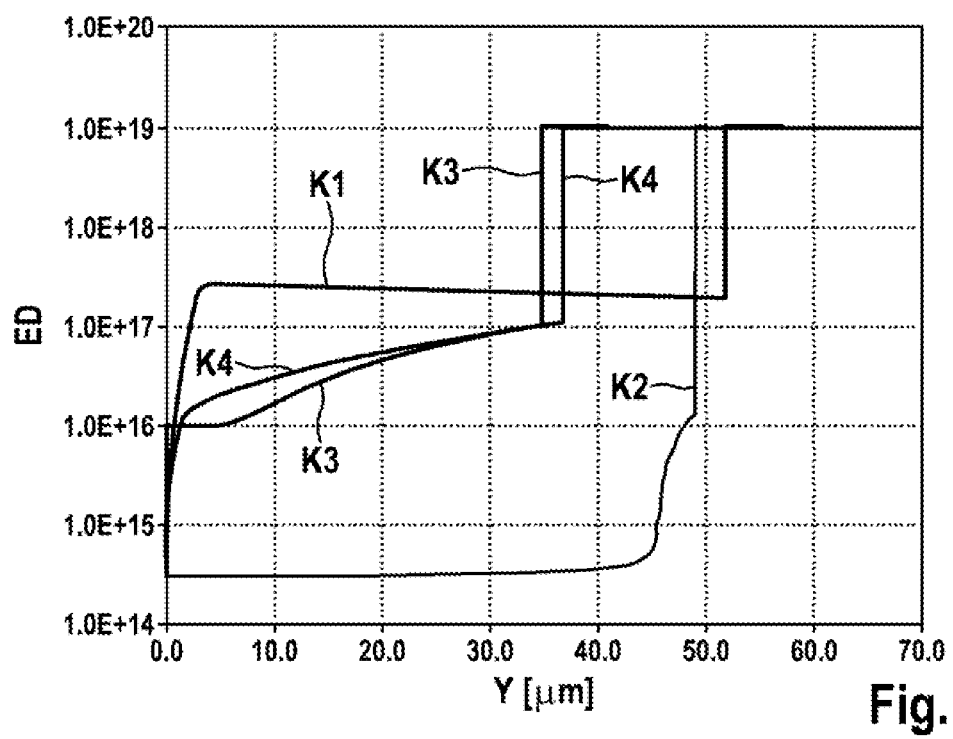
FIG. 5 shows a diagram illustrating electron distributions.

FIG. 5 shows a diagram illustrating electron distributions at the center of mesa region 80, distance Y from the front side of the chip in pm being plotted along the abscissa and electrode density ED per cm$^3$ being plotted along the ordinate. These characteristic lines were ascertained by using 600 V components having a chip area of 26 mm$^2$ at a temperature of 25° C. Characteristic line K1 shows the electron distribution of a traditional high-voltage PN diode made of silicon. Characteristic line K2 shows the electron distribution of a silicon Schottky diode (Si-SBD). Characteristic line K3 shows the electron distribution in a cool SBD. Characteristic line K4 shows the electron distribution with an HV-TJBS according to the present invention. Here again, the barrier height of the Schottky diode, of the cool SBD and of the HV-TJBS according to the present invention amounts to 0.72 eV in each case. With the HV-TJBS, the electron density shown was ascertained at the center of the mesa region. The electron density shown here was ascertained at the center of the n-doped region of the cool SBD.

It is apparent from the curves of the electron distribution shown in FIG. 5 that, in the configuration according to the present invention, flooding of the n-doped region with electrons is comparable to that with a cool SBD and is much lower than that with a high-voltage PN diode made of silicon.

Figure 6:
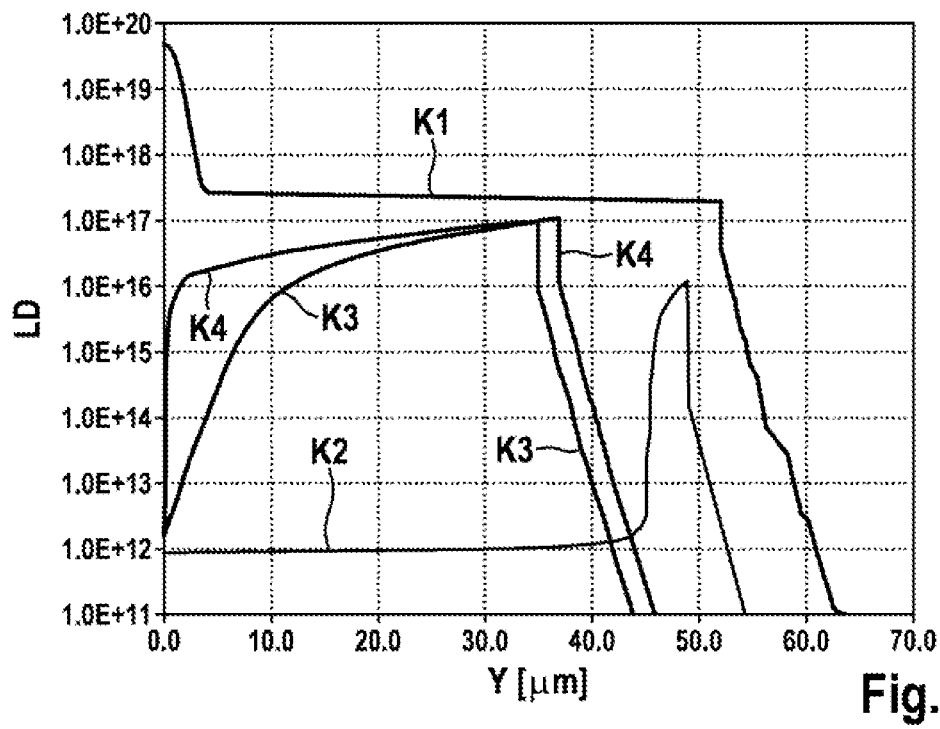
FIG. 6 shows a diagram illustrating hole distributions.

FIG. 6 shows a diagram illustrating hole distributions, with distance Y in μm from the front side of the chip being plotted along the abscissa and hole density LD per cm$^3$ plotted along the ordinate. These characteristic lines were also ascertained using 600 V components having a chip area of 26 mm$^2$ at a temperature of 25° C. Characteristic line K1 shows the hole density of a traditional high-voltage PN diode made of silicon. Characteristic line K2 shows the hole density of a silicon Schottky diode (Si-SBD). Characteristic line K3 shows the hole density of a cool SBD. Characteristic line K4 shows the hole density of an HV-TJBS according to the present invention. Here again, the barrier height of the Schottky diode, of the cool SBD and of the HV-TJBS according to the present invention is 0.72 eV in each case. With the HV-TJBS, the electron density shown here was ascertained at the center of the mesa region. The electron density shown here was ascertained at the center of the n-doped region of the cool SBD.

It is apparent from the curves for the hole distributions shown in FIG. 6 that, with a configuration according to the present invention, flooding of the n-doped region with holes is comparable to that of a cool SBD and is much lower than that with a high-voltage PN diode made of silicon. The stored charge which must be drained off during shutdown is lower in the configuration according to the present invention than in the high-voltage PN diode.

Figure 7:
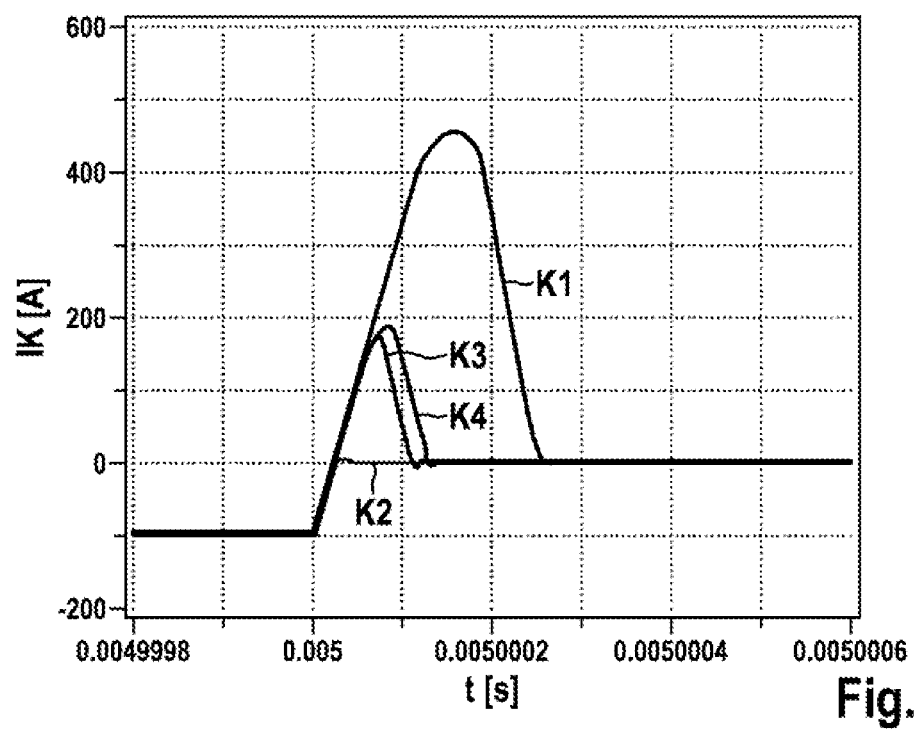
FIG. 7 shows a diagram illustrating storage charge curves.

FIG. 7 shows a diagram illustrating storage charge curves in which time t in seconds is plotted along the abscissa and cathode current IK in amperes is plotted along the ordinate. These storage charge curves are ascertained by using 600 V components having a chip area of 26 mm$^2$ at a temperature of 25° C., in which the shutdown of forward current IF of 100 A is additionally used as a function of a reverse voltage VR of 300 V with a current change dI/dt of 4.4 kA/μs as parameters. Characteristic line K1 shows the storage charge curve for a traditional high-voltage PN diode made of silicon. Characteristic line K2 shows the storage charge curve for a silicon Schottky diode (Si-SBD). Characteristic line K3 shows the storage charge curve for a cool SBD. Characteristic line K4 shows the storage charge curve for an HV-TJBS according to the present invention. The barrier height of the Schottky diode, of the cool SBD and of the HV-TJBS according to the present invention is 0.72 eV in each case.

It is also apparent from the storage charge curves shown in FIG. 7 that, among other things, the switching behavior of an HV-TJBS according to the present invention, although slightly less favorable than the switching behavior of a cool SBD, is nevertheless much better than the switching behavior of a traditional high-voltage PN diode made of silicon.

After all this, the present invention makes a high-voltage trench junction barrier Schottky diode available, which is a special combination of a trench PN diode with a traditional Schottky diode. The breakdown voltage of the PN diode is designed in such a way that it is lower than the breakdown voltage of the Schottky diode. The HV-TJBS according to the present invention has a high current-carrying capacity in the forward direction, has effective shielding action of Schottky effects in the reverse direction, and therefore has a low leakage current and great robustness based on the clamp function of the trench PN diode.

The advantages of an HV-TJBS according to the present invention in comparison with a high-voltage PN diode include a lower forward voltage up to a high current density based on the use of a suitable barrier height of the Schottky contact in combination with high injection at a high current density and a much lower shutdown power loss since fewer charge carriers are injected into the weakly doped region and stored there during forward operation through the Schottky contact.

The advantages of an HV-TJBS according to the present invention in comparison with a high-voltage Schottky diode include a much lower forward voltage at a high current density since the conductivity of the weakly doped region is greatly increased through high injection, a much lower leakage current due to the shielding action of the Schottky effect with the help of the trench PN structure and a much greater robustness due to the clamp function of the trench PN diode.

The advantages of an HV-TJBS according to the present invention in comparison with a cool SBD include a lower forward voltage at a high current density due to a greater high injection and a lower leakage current due to a significantly more effective shielding action of the Schottky effect.

As an alternative to the specific embodiments described above with reference to FIGS. 2 and 3, a Schottky diode according to the present invention may also be implemented by the fact that all of their semiconductor layers described above have the opposite type of conductivity and the designations of the anode connection and the cathode connection are switched.

In the specific embodiment described above with reference to FIG. 3 and FIG. 8, a different p dopant may also be used.

The occupation described above on the basis of FIG. 3 and FIG. 8 preferably takes place through a gas-phase occupation or an implantation.

In all the specific embodiments described above, a trench depth of approximately 2 µm is sufficient for a 600 V HV-TJBS.

In the specific embodiment described above with reference to FIG. 2, the trenches may be filled entirely or only partially with p-doped silicon or p-doped polysilicon.

Metal layers 50 and 60 described above may each be made of one, two or more metal layers situated one above the other. The trenches described above may be situated in a strip configuration or as islands. These islands may be designed as circles, hexagons or other forms.

A Schottky diode according to the present invention may have a breakdown voltage greater than 100 V, as described above. This breakdown voltage may even be higher than 600 V.

A Schottky diode according to the present invention may have a solderable front-side and rear-side metallization.

A Schottky diode according to the present invention is preferably situated in a press-fit diode housing and may be part of a rectifier of an automotive generator, for example.

What is claimed is:

1. A Schottky diode, comprising:
    an n$^+$substrate;
    an n-epitaxial layer having a thickness D epi;
    at least two trenches introduced into the n-epitaxial layer, each trench having a width Wt and a depth Dt;
    mesa regions each having a width Wm, wherein each mesa region is provided between two adjacent trenches;
    a metal layer functioning as a cathode electrode on the rear side of the n$^+$substrate of the Schottky diode; and
    a metal layer functioning as an anode electrode on the front side of the Schottky diode, the metal layer forming an ohmic contact with the trenches and a Schottky contact with the n-epitaxial layer;
    wherein:
        the following equation holds for the depth Dt of the trenches and the thickness D_epi of the n-epitaxial layer: $K \cdot Dt < D\_epi$, where $K > 4$;
        the following equation holds for the ratio of the depth Dt of the trenches to the width Wm of the mesa regions: $Dt/Wm \geq 2$; and
        the following relationship holds: $NA \cdot Wt \gg ND \cdot Wm$, where NA is the doping concentration of the trenches, Wt is the width of each of the trenches, ND is the doping concentration of the n-epitaxial layer, and Wm is the width of the mesa region between two trenches.

2. The Schottky diode as recited in claim 1, wherein the trenches are filled with highly p-doped material to form p regions, and wherein the breakdown voltage of PN junctions between the p regions and the n-epitaxial layer is lower than the breakdown voltage of the Schottky contact between the metal layer and the n-epitaxial layer.

3. The Schottky diode as recited in claim 2, wherein the Schottky diode is operable during breakdown.

4. The Schottky diode as recited in claim 2, wherein the trenches are filled with one of highly p-doped silicon or highly p-doped polysilicon.

5. The Schottky diode as recited in claim 4, wherein the trenches are filled with highly p-doped polysilicon and the metal layer provided on the front side contacts the p-doped polysilicon layer.

6. The Schottky diode as recited in claim 2, wherein the trenches contain boron as the dopant, and the metal layer provided on the front side fills the trenches.

7. The Schottky diode as recited in one of the preceding claim 5, wherein the Schottky diode has a breakdown voltage greater than 100 V.

* * * * *